United States Patent
Ohmi et al.

[11] Patent Number: 5,989,722
[45] Date of Patent: Nov. 23, 1999

[54] REDUCED PRESSURE DEVICE AND METHOD OF MAKING

[76] Inventors: Tadahiro Ohmi, 1-17-301, Komegabukuro, 2-chome, Aoba-ku, Sendai-shi, Miyagi-ken, 980; Masaru Umeda, 2-16, Nihonbashi-Muromachi 4-chome, Chuo-ku, Tokyo 103, both of Japan

[21] Appl. No.: 09/085,238

[22] Filed: May 27, 1998

Related U.S. Application Data

[62] Division of application No. 08/458,755, Jun. 2, 1995, Pat. No. 5,789,086, which is a division of application No. 08/213,079, Mar. 15, 1994, Pat. No. 5,906,688, which is a continuation of application No. 08/097,861, Jul. 26, 1993, abandoned, which is a continuation of application No. 07/990,549, Dec. 14, 1992, abandoned, which is a continuation of application No. 07/536,547, Jul. 10, 1990, abandoned, which is a continuation of application No. PCT/JP89/00023, Jan. 11, 1989, and a continuation of application No. 07/721,450, Aug. 8, 1991, abandoned, which is a continuation of application No. PCT/JP89/01308, Dec. 26, 1989, and a continuation of application No. 08/121,174, Sep. 13, 1993, Pat. No. 5,313,982, which is a continuation of application No. 07/922,370, Jul. 29, 1992, abandoned, which is a continuation of application No. 07/465,226, Mar. 5, 1990, abandoned, which is a continuation of application No. PCT/JP89/00690, Jul. 2, 1989.

[51] Int. Cl.$^6$ .................................................. B32B 9/00
[52] U.S. Cl. ........................... 428/457; 428/469; 428/472
[58] Field of Search ................................... 428/457, 469, 428/472

[56] References Cited

U.S. PATENT DOCUMENTS 5,789,086  8/1998  Ohmi .................................. 428/472.2

*Primary Examiner*—Timothy M. Speer
*Attorney, Agent, or Firm*—Baker & Daniels

[57] ABSTRACT

A reduced pressure device the reduced pressure chamber of which is constructed of stainless steel, and includes a passivation film formed on the exposed interior surface thereof. The film has a thickness more than 50 Å and is composed of two or more layers. One layer contains mainly chrome oxide formed in the vicinity of the interface of the stainless steel and the passivation film. The other layer contains mainly iron oxide formed in the vicinity of the surface of the passivation film. A passivation film may also be used with a thickness of more than 50 Å and containing mainly a mixture of the chrome oxide and the iron oxide. Lastly a passivation film may also be used with thickness of more than 50 Å and containing mainly chrome oxide.

2 Claims, 10 Drawing Sheets

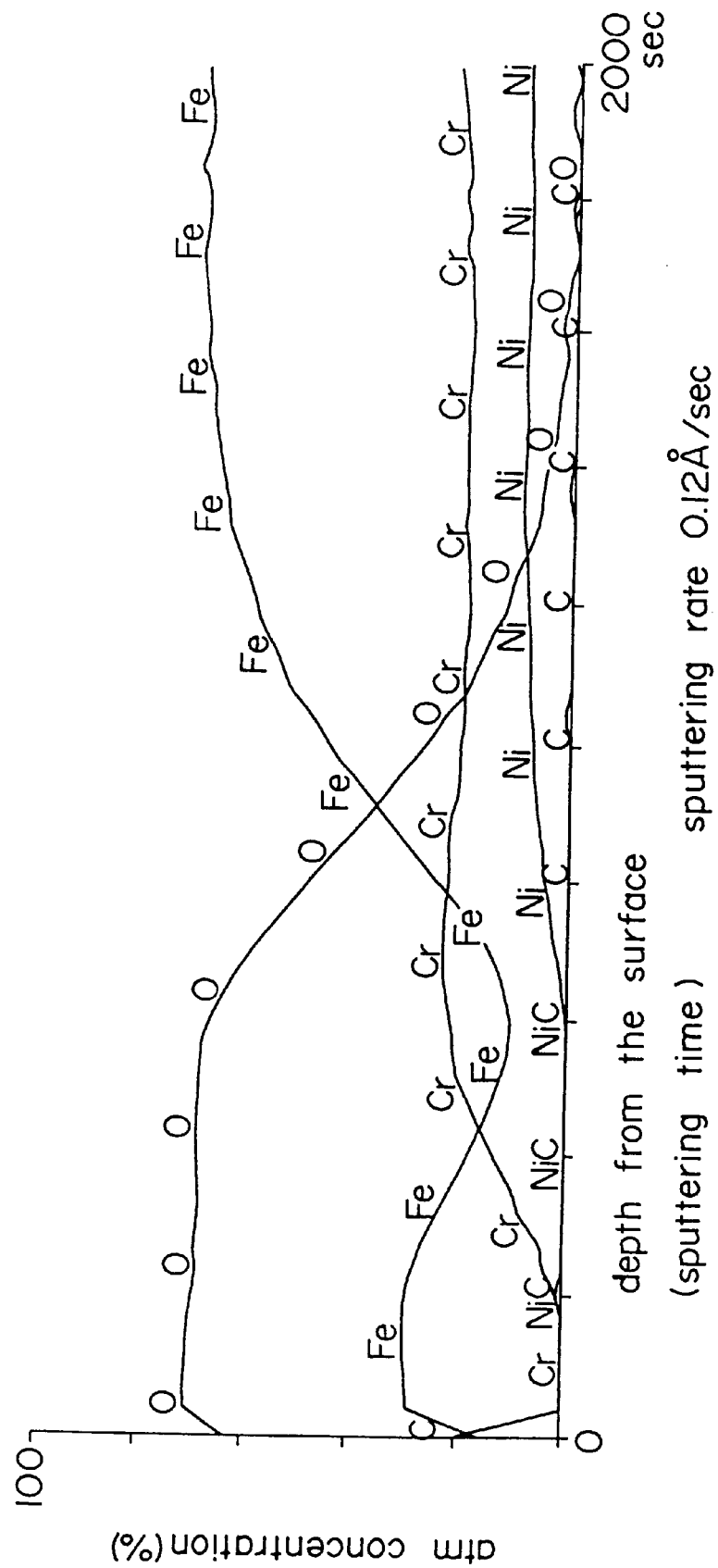

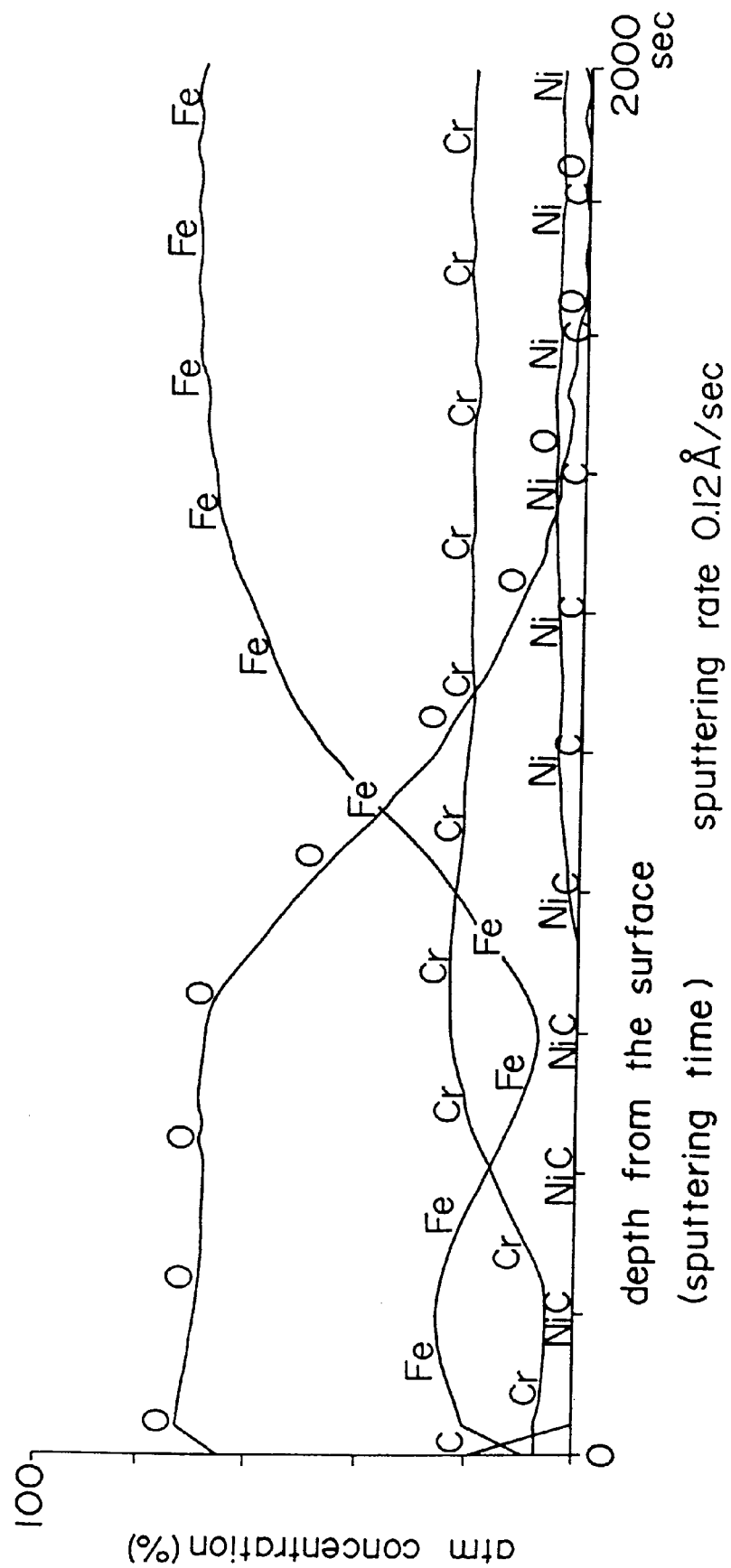

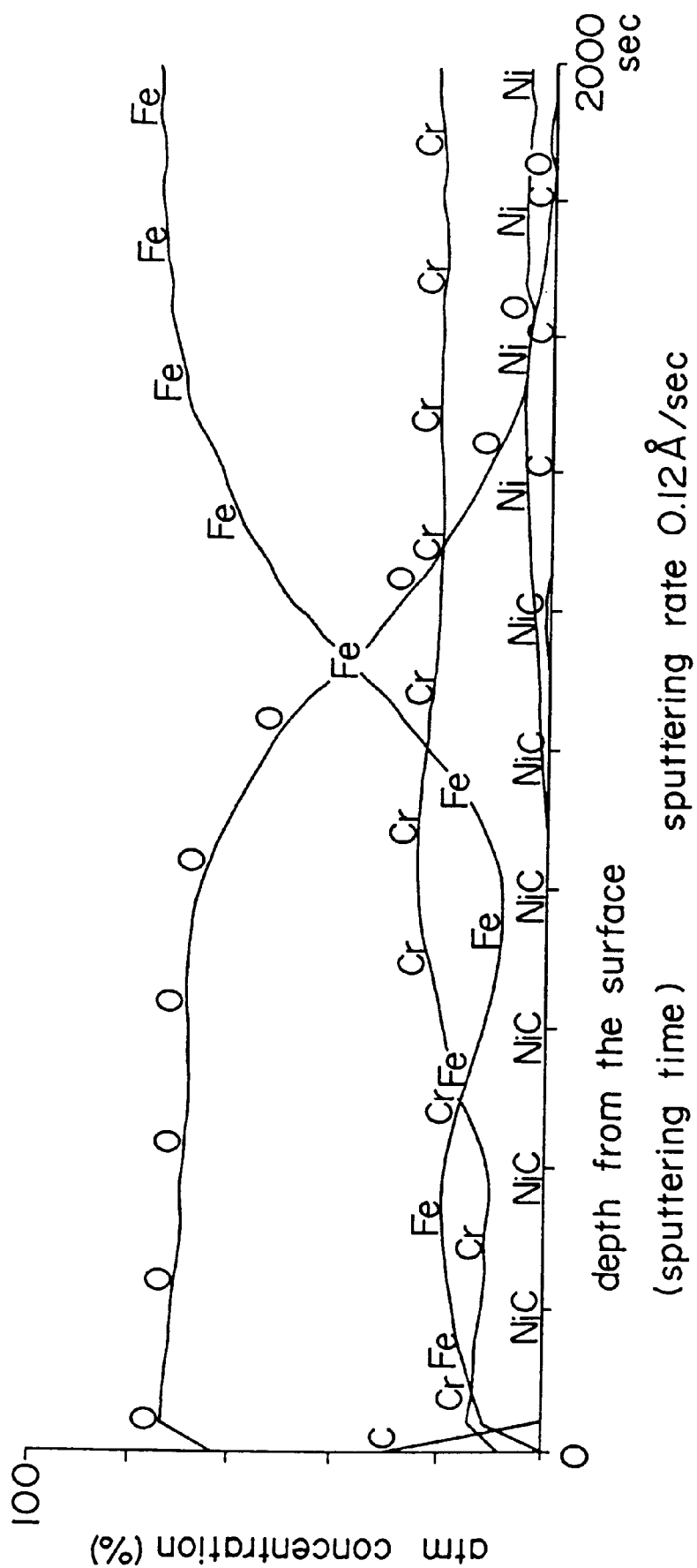

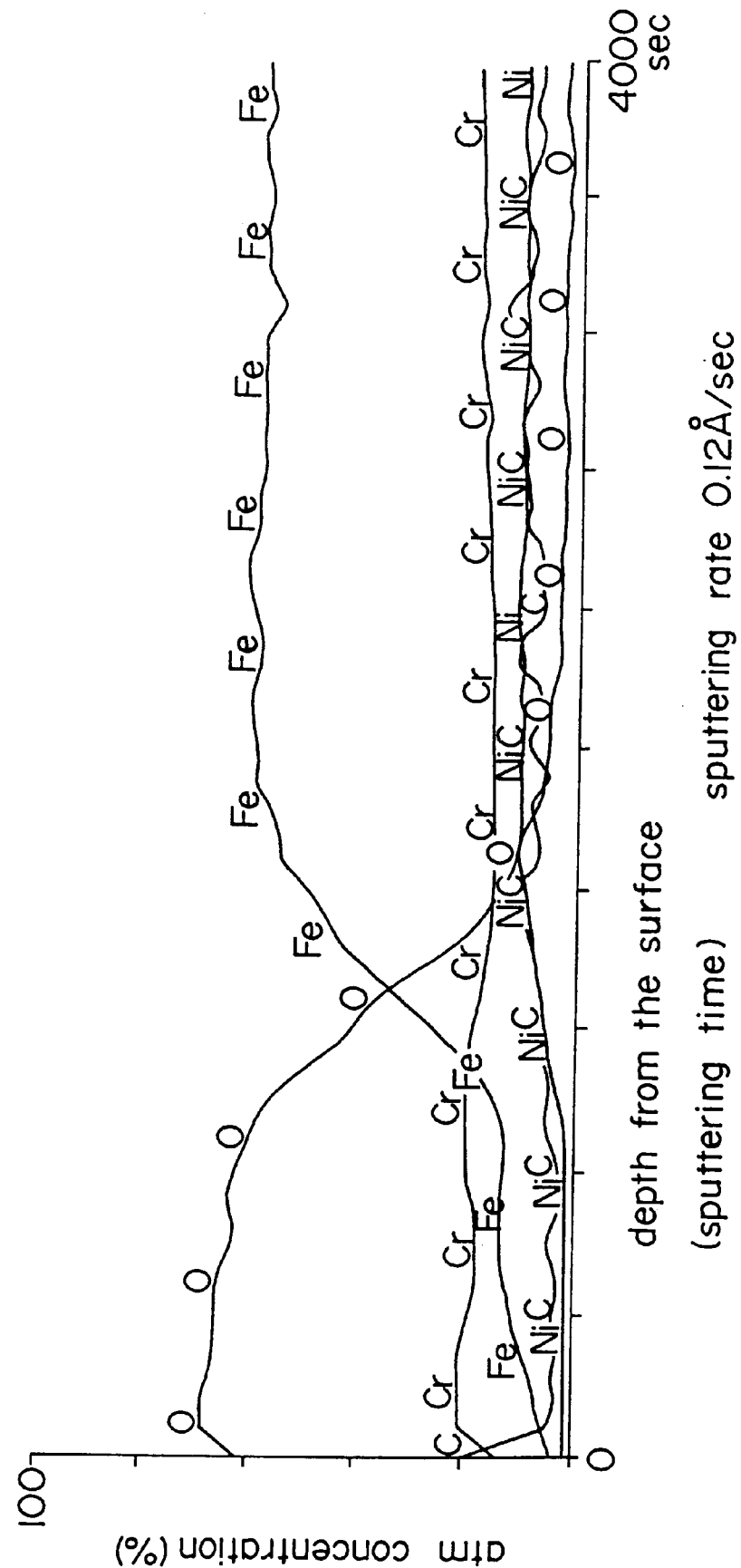

REDUCED PRESSURE DEVICE AND METHOD OF MAKING

This is a division of application Ser. No. 08/458,755, filed Jun. 2, 1995, now U.S. Pat. No. 5,789,086 which is a division of application Ser. No. 08/213,079, filed Mar. 15, 1994, now U.S. Pat. No. 5,906,688 which is a continuation of U.S. patent application Ser. No. 08/097,861, abandoned filed Jul. 26, 1993, which is a continuation of U.S. patent application Ser. No. 07/990,549, filed Dec. 14, 1992, abandoned which is a continuation of U.S. patent application Ser. No. 07/536,547, filed Jul. 10, 1990, abandoned which is a continuation of International application PCT/JP89/00023, filed Jan. 11, 1989, which designated the United States; the present application is also a continuation of U.S. patent application Ser. No. 07/721,450, filed Aug. 8, 1991, abandoned which is a continuation of International application PCT/JP89/01308, filed Dec. 26, 1989, which designated the United States; and the present application is also a continuation of U.S. patent application Ser. No. 08/121,174, filed Sep. 13, 1993, now U.S. Pat. No. 5,313,982, which is a continuation of U.S. patent application Ser. No. 07/922,370, filed Jul. 29, 1992, abandoned which is a continuation of U.S. patent application Ser. No. 07/465,226, filed Mar. 5, 199, abandoned which is a continuation of International patent application PCT/JP89/00690, filed Jul. 2, 1989, which designated the United States.

BACKGROUND OF THE INVENTION

The present invention relates to a reduced pressure device, and more particularly to a reduced pressure device capable of realizing a ultrahigh vacuum and ultraclean process.

In recent years, techniques for realizing ultrahigh vacuum or techniques for supplying fixed gases into a vacuum chamber at a small flow rate to provide an ultraclean, reduced pressure atmosphere have become very important. Such techniques are widely used in the study of material characteristics, the formation of various films, and the manufacture of semiconductor devices with advances in high vacuum techniques. It is therefore desired to obtain a reduced pressure atmosphere, wherein the impurity particles and molecules are reduced to the smallest limit.

Taking a semiconductor device as an example, in order to enhance the degree of integration of an integrated circuit, the search for putting into practical use semiconductor devices which are composed of unit elements, their sizes being 1 $\mu$m to submicron and even to 0.5 $\mu$m or less, is intensively carried out as the size of unit elements decreases year by year.

To manufacture such semiconductor devices it is necessary to repeatedly carry out film formation processes and etching processes for those formed films according to fixed circuit patterns. Usually, such processes are performed by placing silicon wafers into a vacuum chamber which has been evacuated to an ultrahigh vacuum state or into a vacuum chamber at a reduced pressure atmosphere whereinto fixed gases are introduced. If impurities appear in the vacuum chamber during these processes, problems such as the deterioration of film quality and a reduction of the precision of fine processing will take place. This is the reason that un ultrahigh vacuum or an ultraclean reduced pressure atmosphere are required.

One of the most important reasons for hindering the realization of an ultrahigh vacuum and an ultraclean atmosphere has been the release of gases from the surface of stainless steel, which material is widely used in chambers and piping systems. In particular, moisture adsorbed in the surfaces which will be released at a vacuum or reduced pressure atmosphere acts as the greatest source of contamination.

FIG. 8 shows, for a prior art device, the relationship of the total gas leakage amount of a system including a gas piping system and a reaction chamber (the total amount of gases released from the internal surfaces of the piping system and the reaction chamber and the gases due to leakage into the chamber from the exterior) and the contamination of gas at different flow rates.

In order to realize a highly precise process, there is a tendency to adopt smaller and smaller gas flow rates. For example, the selection of a flow rate of 10 cc/min or less has become generally accepted. If the flow rate of 10 cc/min is used and the system total leakage is in a range of $10^{-3} \sim 10^{-6}$ Torr l/sec for a currently used prior art device, the purity of gas will reduce to 10 ppm~1%. Therefore such a process is far from being an ultraclean process.

The present invention comprises an ultraclean gas supply system and permits reducing the external leakage amount below the detectable limit of $1 \times 10^{-11}$ Torr l/sec of existing detectors. However, because of internal leakage, i.e., the existence of released gas emanating from the internal stainless steel surfaces, the present invention fails to lower impurity concentrations in a reduced pressure atmosphere. In the case of stainless steel, the minimum amount of gas released from surfaces which are treated with prior art ultrahigh vacuum techniques is $1 \times 10^{-11}$ Torr l/sec·cm$^2$. By way of example, since the internal exposed surface area of a chamber is at least, 1 m$^2$, the total leakage amount will be $1 \times 10^{-7}$ Torr l/sec and gas with a purity of 1 ppm can be obtained only if the gas flow rate is 10 cc/min. Therefore it is evident that, if the gas flow rate is decreased still further, the purity will drop further.

In order to lower the degassing components released from the internal surface of chamber to the same level of $1 \times 10^{-11}$ Torr l/sec·cm$^2$, a surface treating technique for reducing the amount of gas from stainless steel is required.

Many gases of all kinds are employed in the semiconductor manufacturing process such as relatively stable general gases ($O_2$, $N_2$, Ar, $H_2$, He) and other special gases with, respectively, strong reactivity, corrosivity and toxicity. The existence of moisture in a special gas atmosphere will cause a hydrolysis reaction which produces hydrochloric acid and fluoric acid, since $BCl_3$ and $BF_3$ etc., all having strong corrosivity, occur in special gases. Because of considerations of reactivity, corrosion-resistance, high strength, readiness of secondary processing, weldability and the ability to polish internal surfaces, stainless steel is usually used as the material for piping and chambers for dealing with these gases.

However, although the corrosion-resistance of stainless steel in an atmosphere of dry gas is very good, stainless steel will be easily corroded if it is placed in an atmosphere formed of chlorine or fluorine gases. Because of the above-mentioned facts it is necessary to treat stainless steel for corrosion-resistance after polishing the stainless steel surface. There have been several treatment methods such as Ni—W—P coating (method of cleanness coating). This method not only causes cracks, and easily forms pin holes but also has the disadvantage that the amount of moisture and solvent residue absorbed on the internal surfaces is great since the process adopts the method of wet coating. Moreover there are other methods such as passivation treatment for producing a thin oxide film on the surface of metal.

Stainless steel can be passivated only by immersing it into a liquid containing an efficient oxidizer. The passivation treatment of stainless steel is usually carried out by immersing it into a solution of nitric acid. However, because this method is still a wet process there remains much residue of moisture and treatment solution in the pipes and chambers. Particularly chlorine and fluorine gases will cause severe damage to stainless steel being treated in this way.

Therefore although it is very important for an ultrahigh vacuum technique and semiconductor process to use chambers and gas supply systems constructed of stainless steel on which a passivation film is formed for occluding and adsorbing less moisture and which is capable of resisting damage causes by corrosive gases. Such a technique has not been developed in the prior art.

In view of the drawbacks of the prior art techniques it is an object of the present invention to provide a ultrahigh vacuum and ultra-clean reduced pressure device capable of reducing impurities resulting from released gas and having excellent corrosion-resistance.

Another object of the invention is to provide a reduced pressure device capable of performing self-cleaning and self-maintenance.

SUMMARY OF THE INVENTION

The concerned reduced pressure device according to the present invention, in one form thereof, comprises a main body which is constructed of stainless steel. A two or more layer passivation film with a thickness greater than 50 Å is formed on at least a part of the exposed interior surface of the stainless steel located inside the device. One layer contains mainly chromium oxides formed in the vicinity of the interface of the stainless steel and the passivation film. The other layer contains mainly iron oxides formed in the vicinity of the surface of the passivation film. It is desirable that a film is then formed by heating the stainless steel to allow it to be oxidized at a temperature between 150~400° C.

The reduced pressure device according to the present invention in one form thereof, comprises a main body which is constructed of stainless steel. A passivation film with a thickness greater than 50 Å and containing mainly a mixture of chromium oxides and iron oxides is formed on at least a part of the exposed interior surface of stainless steel located inside the device.

It is desirable, as in the case of the passivation film that a film with a thickness of more than 100 Å is then formed by heating the stainless steel to allow it to be oxidized at a temperature between 400~50° C.

The reduced pressure device according to the present invention, in yet another form thereof, comprises a reduced pressure device the main body of which is constructed of stainless steel. A passivation film with a thickness greater than 50 Å and containing mainly chromium oxides is formed on at least a part of the exposed interior surface of the stainless steel located inside the device.

It is desirable, as in the case of the passivation film that a film with a thickness of more than 130 Å is then formed by heating the stainless steel continuously for nine (9) hours to allow it to be oxidized at a temperature greater than 550° C.

The reduced pressure device according to the present invention, in yet a further form thereof, is characterized in that the stainless steel on which the passivation film is formed has a surface which possesses a flatness with a height difference between convex parts and concave parts within any area 5 μm in radius of less than 1 μm.

The reduced pressure device according to the present invention, in still another form thereof, is characterized in that a gas supply unit for supplying ultrahigh pure gases is connected to the reduced pressure chamber. The main body of the gas supply unit is constructed of stainless steel, and the passivation film is also formed on at least a part of the exposed interior surface of stainless steel inside the gas supply unit.

The reduced pressure device according to the present invention, in yet still another form thereof, is characterized in that a gas cylinder for supplying ultrahigh pure gases via the gas supply unit is connected to the reduced pressure chamber. The main body of the gas cylinder is constructed of stainless steel. The passivation film is also formed on at least a part of the exposed interior surface of the stainless steel inside the cylinder.

The reduced pressure device according to the present invention, in a still further embodiment thereof, is characterized in that, in the embodiment which has a passivation film comprised of chromium oxides, the gas supply unit is provided with a cleaning gas supply unit for removing, by means of etching, deposits which stick to the interior walls of the reduced pressure chamber. Chlorine and fluorine gases are desirable for use as cleaning gas. The reduced pressure chamber may be provided with a heater capable of heating the chamber to about 350° C.

The reduced pressure device according to the present invention may include one or a combination of two or more semiconductor manufacturing units, gas cylinders, gas valves and pipes.

BRIEF DESCRIPTION OF THE DRAWINGS

FIG. 6 and FIGS. 7(*a*)–7(*d*) are graphs showing the distribution of elements in a surface after oxidation.

DESCRIPTION OF THE PREFERRED EMBODIMENTS

Figure 1:
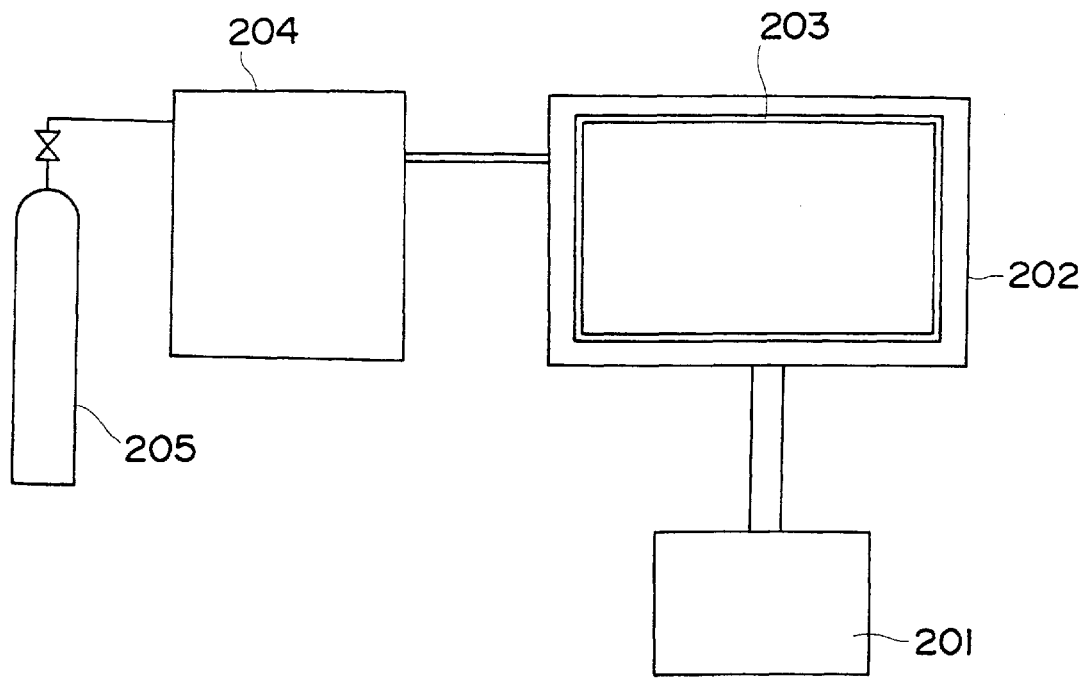
FIG. 1 is a schematic representation of a reduced pressure device illustrating one embodiment of the present invention.

FIG. 1 is a schematic representation of a reduced pressure device illustrating one embodiment of the present invention. In FIG. 1, 201 is a vacuum exhaust unit, for example, a turbomolecular pump with an exhaust volume of 2000 l/min; 202 is a reduced pressure chamber which is constructed of stainless steel (SUS316L) and on the inner wall of which a passivation film is formed; and 204 is a gas supply system. By introducing gas into the reduced pressure chamber 202 at a small flow rate, for example, 0.01~100 cc/min, the reduced pressure chamber can be maintained at a reduced pressure state, for example, $1\times10^{-4} \sim 1\times10^{-1}$ Torr, with a fixed gas. Gas supply system 204 is therefore composed of stainless steel pipes, joints, valves, mass flow controller, pressure reducing valves and ceramic filter, the detailed description of which is omitted.

Gas cylinder 205 supplies fixed gases to a gas supply device, including general gases such as Ar, He, $H_2$, $O_2$ etc. or corrosive gases such as HCl, $Cl_2$, $BCl_3$ etc., as desired. Although only one cylinder is illustrated in FIG. 1 for convenience, several cylinders 205 may be used according to actual needs.

In addition, though only passivation film 203 of the inside surface of reduced pressure chamber is illustrated in FIG. 1, the main parts of the gas supply system and the gas cylinder etc. are constructed of stainless steel (SUS316L, US304L and so on) and the passivation film of the present invention is formed on all interior surfaces which will be in contact with gas since these interior surfaces will therefore be exposed to corrosive gases.

In order to form a passivation film, the surface of the stainless steel is first polished to a mirror finish. For example the method of electrolytic polishing may be used to cause the maximum height difference $R_{max}$ between the concave parts and the convex parts of the surface, i.e., the flatness of the surface, to be within 0.1–1.0 $\mu$m. The stainless steel surface is then heated at 400° C. in an atmosphere of pure oxygen for about one hour. As a result oxidation film 203 is formed having a thickness of 110 Å.

The main component of the oxide is different in various areas of the oxidation film. Iron oxide is the main component in the surface of the oxidation film and Cr oxide is the main component in the region near the interface of the stainless steel and the oxidation film. The detailed result of the oxidation composition will be described hereinbelow with Tables 1, 2 and 3.

Mirror polishing of the surface of stainless steel may, for example be accomplished with the technique of electrolytic polishing for interior surfaces of pipes. The technique of composite electrolytic polishing or the like may be used for the interior surfaces of the chambers and cylinders. As for the method of oxidation, taking the oxidation of a pipe as an example, after purging the interior surface of the pipe to sufficiently remove the moisture by using ultrapure Ar or He (moisture content less that 1 ppb), the interior surface is further purged at an elevated temperature of 150–200° C. to release almost all of the $H_2O$ molecules adsorbed in the interior surface. The electric current is then applied directly to the pipe to heat it to 400° C. to effect oxidation of its interior surface while passing pure oxygen with a moisture content of no more than 1 ppb through the pipe.

Figure 2:
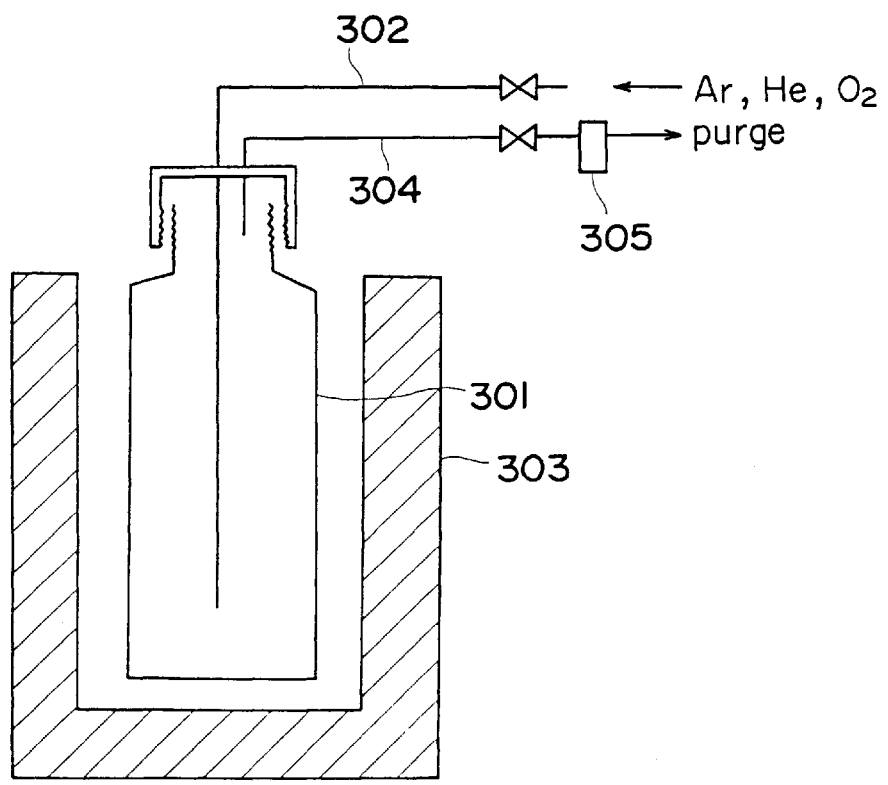
FIG. 2 is a schematic representation illustrating a cylinder for use with an oxidization method.

It is most important to form-a passivation film in the gas cylinder for such a reduced pressure device because such a gas cylinder will contain stock reactive gases for a long time. In order to keep the gas pure, a passivation film that is excellent in corrosion-resistance and does not occlude impure gases is nearly indispensable. The present invention has, for the first time, realized the formation of this kind of film. The method of oxidizing the cylinder is shown in FIG. 2.

For example, in the case of oxidizing the interior surface of gas cylinder 301, to remove moisture, ultrapure Ar or He at room temperature is introduced into the cylinder at a flow rate 10 l/min from gas introducing pipe line 302 to purge the cylinder sufficiently. Dewpoint hygrometer 305 disposed in purge line 304 is used to determine whether moisture removal has been completed. After that, the whole cylinder is heated to 150–400° C. by the use of electric heater 303 to release nearly all of the $H_2O$ molecules adsorbed in the interior surface. Ultrapure oxygen is then introduced into the cylinder and the cylinder is heated to a given temperature (for example 400–600° C.) by using the electric heater to oxidize its interior surface. The passivation film formed in such a way is extremely stable and resistant against corrosive gases such as HCl, $Cl_2$, $BCl_3$, $BF_3$ and the cylinder having this passivation film can contain the corrosive gases for a long time without being damaged.

Figure 3:
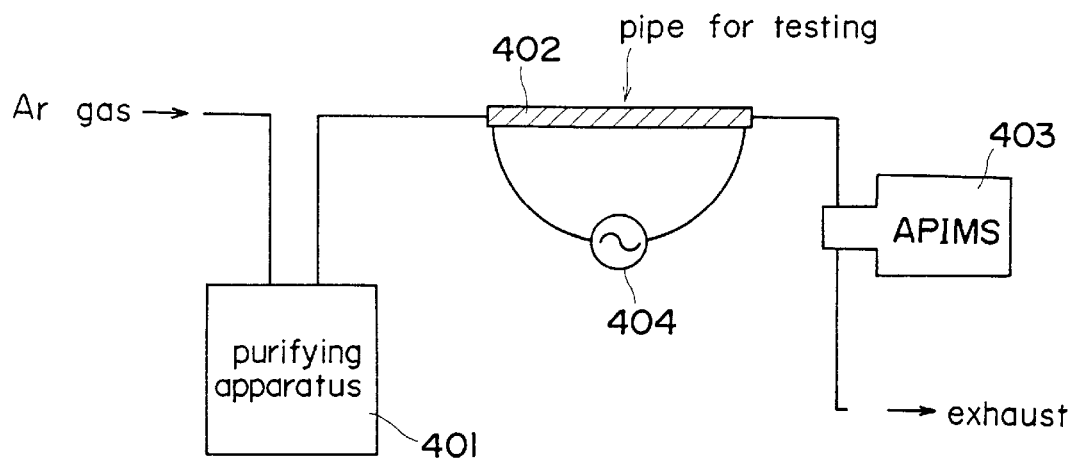
FIG. 3 shows the construction of an experimental apparatus for examining the degassing characteristics.
Figure 4:
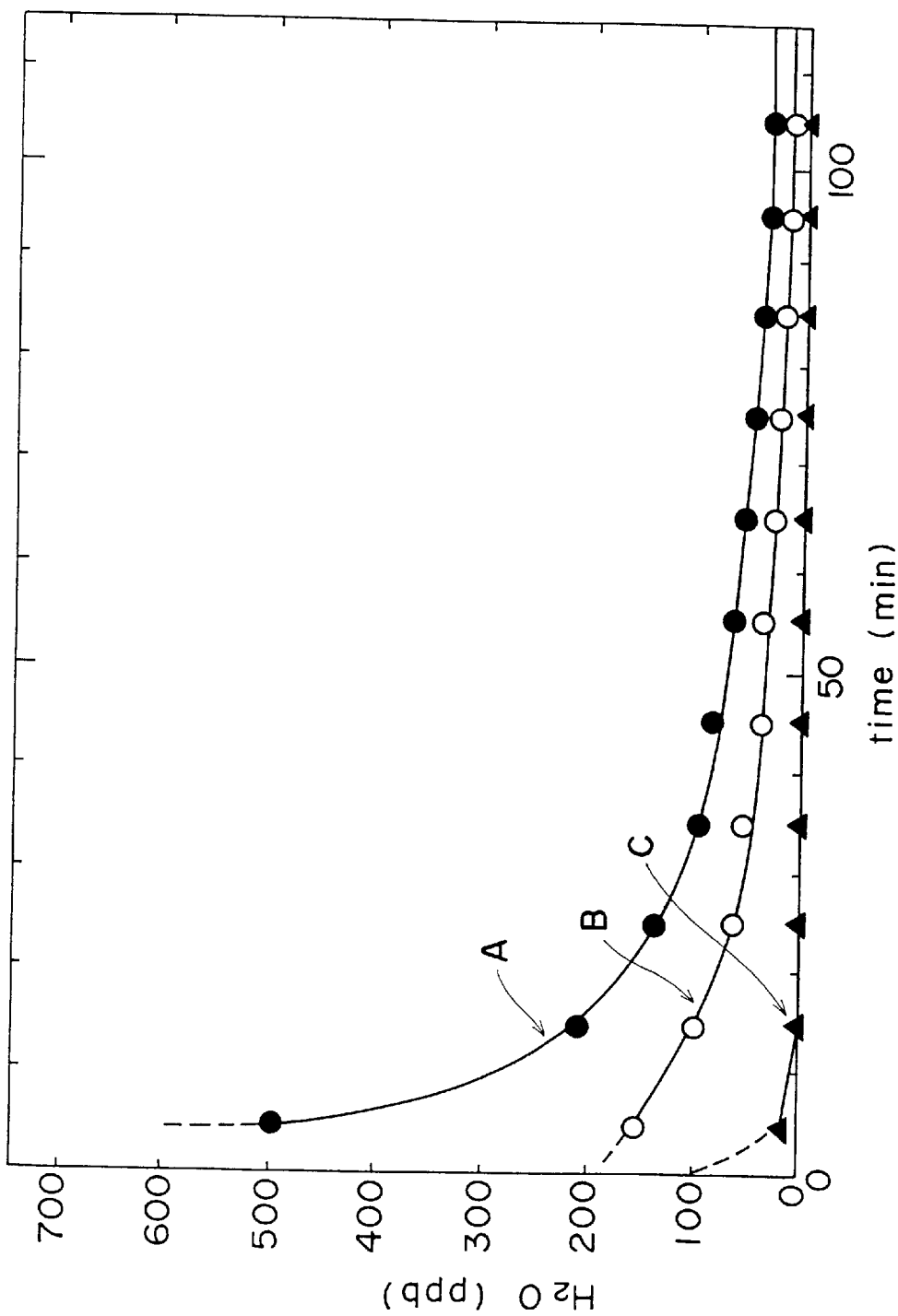
FIG. 4 is a graph showing the experimental results of the device of FIG. 3.
Figure 5:
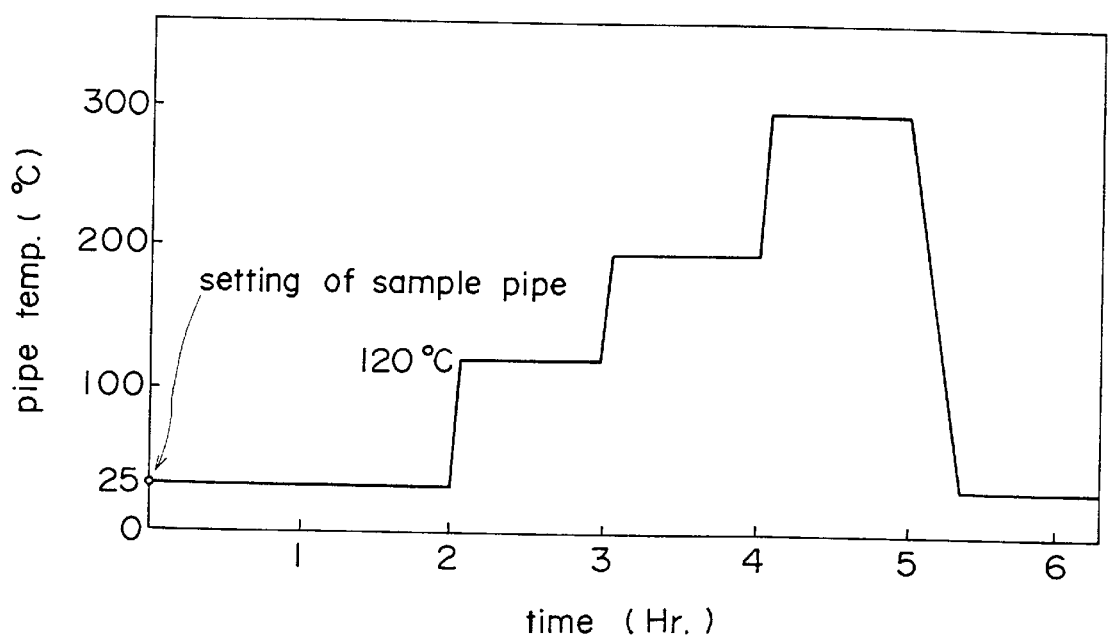
FIG. 5 is a time chart showing an elevated temperature cycle.

In FIG. 4, the experimental results of the degassing characteristics of this passivation film are shown. The experiment is performed for pipes 2 m in length and ⅜ inch in diameter. The construction of the experimental device is shown in FIG. 3. That is, experimental samples of the Ar gas flow through gas purifying apparatus 401 and are then passed through SUS pipe 402 at the flow rate of 1.2 l/min. The moisture content contained in the gas is measured by APIMS 403 (Atmospheric Pressure Ionization Mass Spectrograph).

The results of the sample purges at room temperature are shown in FIG. 4. The types of pipe used in the experiment include pipe (A) having its interior surface polished by the method of electrolytic polishing, pipe (B) which underwent passivation treatment with nitric acid after being polished by the method of electrolytic polishing and pipe (C) which has a passivation film of the present invention. FIG. 4 shows the experimental results with curves A, B and C respectively. Before performing the experiment the pipes were placed for about one week in a clean room wherein the relative humidity was 50% and temperature was 20° C.

It is evident from curves A and B of FIG. 4 that a large quantity of moisture has been detected from both pipe A which was treated by electrolytic polishing and pipe B which underwent a passivation treatment with nitric acid after electrolytic polishing. After passing gas through the pipes for one hour the respective moisture contents detected from pipe A and pipe B are 68 ppb and 36 ppb. The fact that even after passing gas for two hours the moisture contents are still high at respectively 41 ppb and 27 pb for pipe A and pipe B shows that the moisture contents of A and B pipes do not decrease easily. Compared thereto, for pipe C having a passivation film of the present invention, the moisture content dropped to 7 ppb after passing gas for 5 minutes and further more dropped to 3 ppb, the background level, after 15 minutes. This confirms that pipe C has an excellent adsorbed gas release characteristic.

Subsequently, pipe 402 was heated by the use of electric power from power source 404 to change the temperature of the pipe according to the temperature-time chart. Table 1 shows the average values of the moisture content at temperatures ranging from the room temperature to 120° C., 120° C. to 200° C., and 200° C. to 300° C. From the results shown in Table 1 it is obvious that the amount of moisture released from the stainless steel pipe of the present invention is an order of magnitude less than that released from other pipes. This means that the pipe according to the present invention adsorbs little moisture and releases the moisture easily so that this kind of pipe is most suitable for being used to supply ultrapure gas. Moreover, the reduced pressure chamber (vacuum chamber) 202 (FIG. 1) of the present invention can realize the degree of vacuum of $10^{-11}$–$10^{-12}$ Torr after baking, which is an excellent characteristic for an ultrahigh vacuum device.

The oxidation film obtained by the oxidation of surface of stainless steel will now be explained. Table 2 shows the relationships of film thickness and refractive index versus oxidation temperature and oxidation time in the case of oxidizing SUS316L and SUS304L with ultrapure oxygen. Table 3 lists the thickness and refractive index of the oxidation films formed on the surface of SUS316L at 400~600° C. with the oxidation time being 1~9 hours. The film thicknesses only depend on the temperatures at the oxidation temperature of 400~500° C. without correlating with the oxidation time. This suggest that the oxidation process of SUS is the process described by the model of Cabrea and Mott. Therefore, if the temperature is kept constant, the oxidation film will grow to a given film thickness and a compact oxidation film of uniform thickness and without pin holes can be formed.

On the other hand, because the process of oxygen diffusion in oxidation film will occur at the same time when the temperature rises to 550° C. or 600° C., the oxidation film will grow little by little along with the oxidation time.

Figure 6:
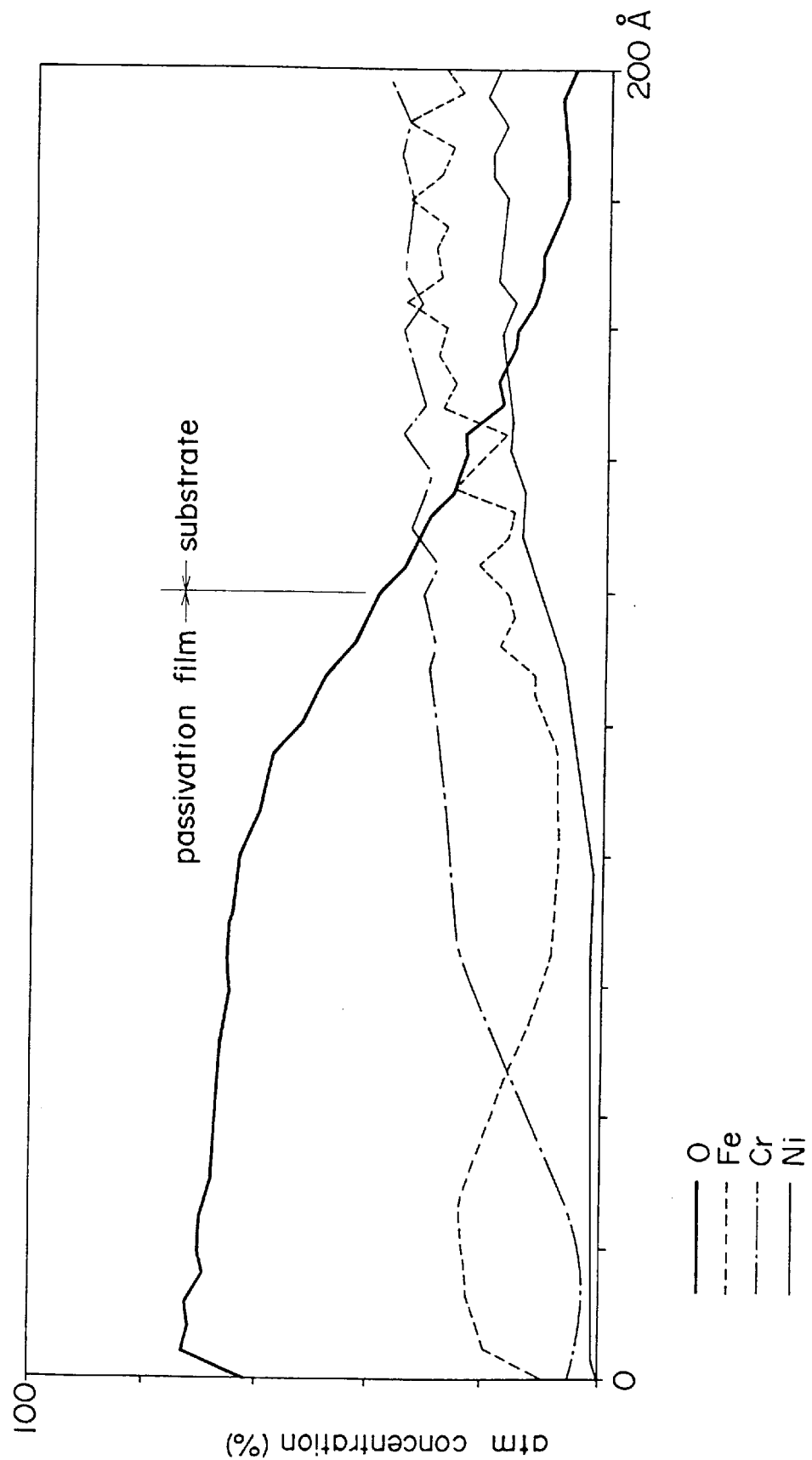
Figure 8:
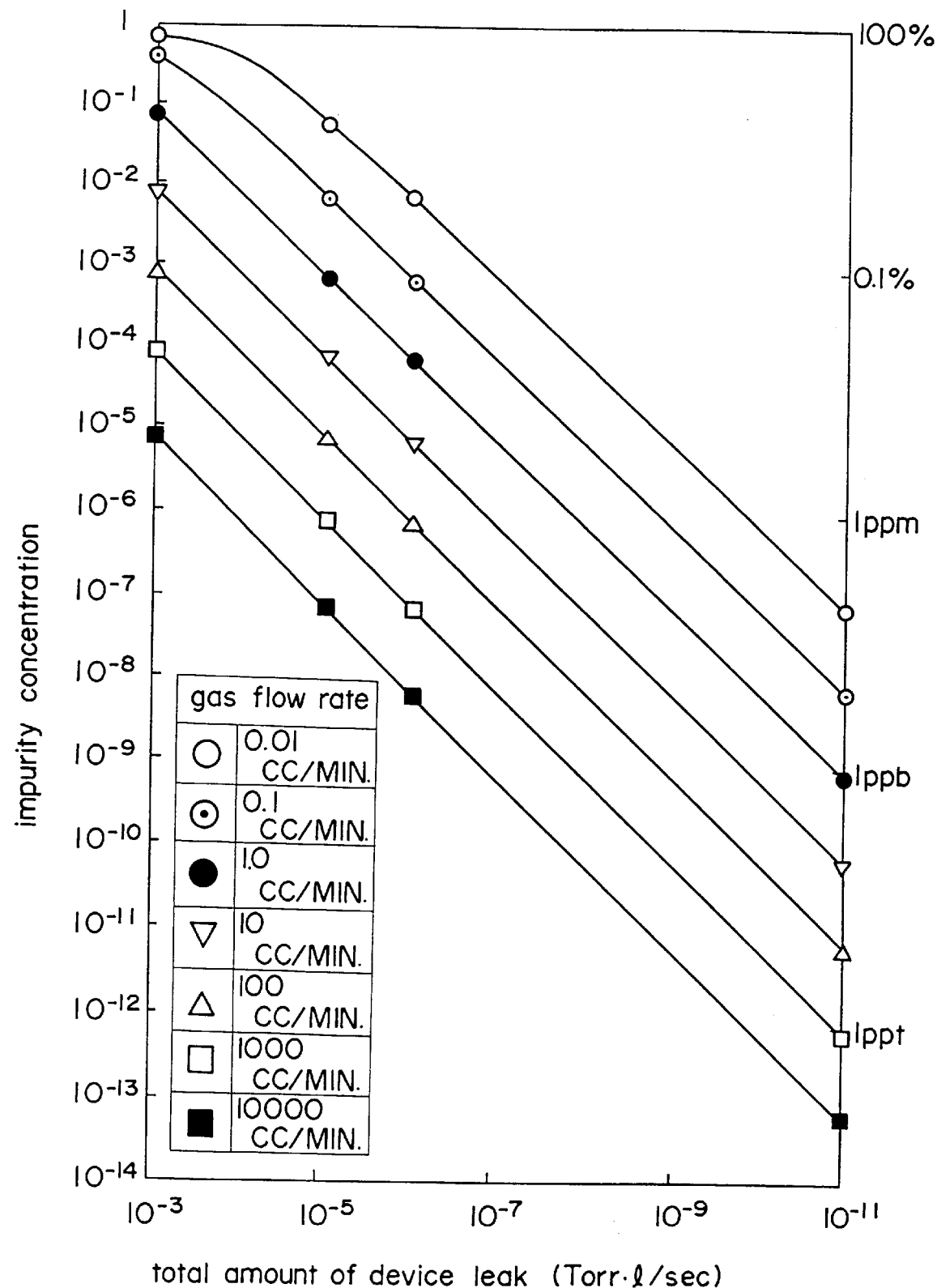
FIG. 8 is graph showing the relationship of the total leakage amount and the concentration of impurities for a prior art device.

FIG. 6 illustrates the element distribution in the surface of SUS316L, measured by ESCA, after oxidation at 500° C. for one hour. It is known that the Fe concentration is high in the vicinity of the surface and the Cr concentration is high in the deep part. This fact shows that the Fe oxide in the vicinity of the surface and the Cr oxide in the vicinity of the interface of the oxide film and SUS substrate form a two-layer structure. And this fact is confirmed by the energy analysis of the ESCA spectrum. The result shows that the chemical shift due to the formation of the Fe oxide in the vicinity of the surface can be observed and that in the deep part this chemical shift does not occur, and moreover that the chemical shift due to the formation of the Cr oxide cannot be observed except in the deep part. The reports about the formation of such two-layer structure through the oxidation of SUS have not been confirmed up to now. Although the mechanism and the reason for the excellent corrosion-resistance and adsorbed gas releasing characteristic of the reduced pressure device of the present invention is not entirely clear, it may be thought of as the result of the formation of this compact two-layer film.

In addition, in order to form a compact oxidation film it is important to remove the transmuted layer on the surface of stainless steel produced during its surface machining and to make its surface flat. Although the magnitude of $R_{max}$ ranging from 0.1~1.0 $\mu$m is used as surface finish in the present embodiment, from the experimental results it has been known that, if the maximum height difference of concave parts and convex parts within any circle 5 $\mu$m in radius is less than 1 $\mu$m, a good enough passivation film can be formed.

FIGS. 7(a)–7(d) show, corresponding to FIG. 6, the element distribution of the surface of a passivation film formed under changed oxidation conditions.

The oxidation conditions of FIGS. 7(a), (b), (c), (d), respectively, are (a) 400° C., 4 hours; (b) 500° C., 4 hours (c) 500° C., 4 hours; (d) 550° C., 9 hours. With the rise of the oxidation temperature and the increase of the oxidation time the rate of growth of chrome oxide film in the vicinity of the surface becomes high. At the condition of oxidation temperature 550° C., oxidation time 9 hours, the quantity of chrome oxide film is more than that of Fe oxide film even in the vicinity of the surface. With the increase of chrome oxide film in the vicinity of the surface, the passivation film is more resistant against chemical corrosion. For example, a surface having this kind of passivation film is not corroded at all by gases of the chlorine system. As a semiconductor device, it is the routine duty of the reaction chamber to deposit several layers of insulator films such as Si single crystal, $SiO_2$, $Si_3N_4$, AlN and films of metals such as Al, Al—Si, Al—Cu—Si, W, Mo, Ta, Ti, Tin, Cu. Generally, these films are formed in the methods of CVD (Chemical Vapor Deposition) and Sputter. With prior art devices, even those films should be deposited on semiconductor wafers, large amounts of deposits adhered to the inner wall of the reaction chamber during the formation of these films. Because these extraneous materials will become the sources of dust and result in pattern defects in films, for a CVD device it is necessary almost every day to open the reaction chamber and to remove deposits adhering to the inner wall of the chamber, which leads to an extreme low working ratio. However, by using the reaction chamber having a passivation film of the present invention on its interior surface, deposits adhering to the inner wall of reaction chambers can be removed by etching by elevating the temperature of the reaction chamber to 200~350° C. at regular intervals and passing cleaning gas through the reaction chamber such as chlorine gases, for example $Cl_2$ and HCl gases, or fluorine gases. Due to the extreme flatness of the interior surface of the chamber, and of the passivation film which is excellent in both chemical and mechanical properties which is formed on the interior surface of the reaction chamber, the adhesive strength of the deposits adhering to the interior walls of the reaction chamber is very weak and the removal of deposits by etching is therefore exceedingly effective.

Thus a semiconductor manufacturing device possessing the properties of self-cleaning and self-maintenance has been realized for the first time according to the present invention. With the development of the semiconductor manufacturing device possessing the characteristics of self-cleaning and self-maintenance, the full automation of semiconductor manufacturing lines also become possible for the first time.

As listed in Table 2 and 3, if the surfaces of stainless steel are oxidized in very pure oxygen at a temperature higher than 400° C. to form a passivation film, after mirror polishing of the surfaces of stainless steel and after washing and drying the surfaces sufficiently, film thicknesses are usually larger than 100 Å.

Although the above-stated description concerned the device shown in FIG. 1 as an embodiment of the present invention, the present invention is also applicable to an ultrahigh vacuum experimental device, RIE device, sputter device, CVD device or the like. As shown in FIG. 1, all components including the gas supply system, gas cylinder and so on comprise a reduced pressure device. Therefore it is self evident that gas cylinders and gas valves and pipes on the interior surfaces of which passivation films of the present invention are formed are included in the reduced pressure device of the present invention. The same is also true of vacuum pumps. Further it is evident that the mechanical parts disposed in reduced pressure chamber 202, for example a mechanism for transporting wafers, are also included in the reduced pressure device of the present invention if passivation films are used on these parts.

Additionally, though all of the exposed surfaces in the interior of the device are almost completely coated with the oxidation films in the embodiment, it is also possible to form the oxidation films only on the surface regions that can make the most of the formation of oxidation films such as large interior surface areas, for example, the interior surfaces of a reduced pressure chamber.

And moreover, although the stainless steels of SUS304L, SUS316L are used in the above embodiment, the stainless steels of the Fe~Cr system, and Fe~Cr~Ni system can also be used. Further, as for the structures of stainless steels, the ferrite system, martensite system, and austenite system can all be used.

According to the present invention, the quantity of impurities due to gases released from interior surfaces of a reduced pressure device can be reduced. Furthermore, an ultrahigh vacuum and ultra-clean reduced pressure device having excellent corrosion-resistance can be realized by forming oxidation films containing no pin holes on the interior surfaces of a reduced pressure device constructed of stainless steel.

With the realization of a reduced pressure device having passivation films that are excellent in corrosion resistance and which almost do not release gases from its interior surfaces, the ultrahigh vacuum and ultra-clean reduced pressure processes have become possible.

In addition to the above-mentioned effects, self-cleaning and self-maintenance of a reduced pressure device have also become possible.

While this invention has been described as having a preferred design, it will be understood that it is capable of further modification. This application is therefore intended to cover any variations, uses, or adaptations of the invention following the general principles thereof and including such departures from the present disclosure as come within known or customary practice in the art to which this invention pertains and fall within the limits of the appended claims.

TABLE 1 amount moisture released from the sample pipe

| | Temp. (° C.) | | |
|---|---|---|---|
| Sample | Room Temp. ~120 | 120~200 | 200~300 |
| electrolytic polished | 420 | 600 | 860 |
| treated with nitric acid | 750 | 630 | 990 |
| this invention | 25 | 70 | 100 unit (ppb) |

TABLE 2 thickness of passivation film

| | | SUS316L | | SUS304L | |
|---|---|---|---|---|---|
| oxidation temperature (° C.) | oxidation time (hr) | film thickness (Å) | refractive index | film thickness (Å) | refractive index |
| 400 | 1 | 114.0 | 2.71 | 78.8 | 3.26 |
| | 4 | 110.9 | 2.87 | 74.2 | 3.41 |
| 500 | 1 | 125.7 | 2.93 | 95.8 | 3.60 |
| | 2 | 126.1 | 2.91 | 95.2 | 3.50 |
| | 4 | 126.8 | 2.96 | 91.3 | 3.81 |
| 550 | 1 | 130.9 | 3.02 | 102.9 | 3.56 |
| | 4 | 141.8 | 3.13 | 110.9 | 3.76 |

TABLE 3 passivation film of SUS316L

| oxidation temperature (° C.) | oxidation time (hr) | film thickness (Å) | refractive index |
|---|---|---|---|
| 400 | 1 | 114 | 2.71 |
| | 4 | 110 | 2.87 |
| 500 | 1 | 125 | 2.93 |
| | 2 | 126 | 2.91 |
| | 4 | 126 | 2.96 |
| | 9 | 124 | 2.90 |
| 550 | 1 | 130 | 3.02 |
| | 4 | 141 | 3.13 |
| | 9 | 164 | 2.98 |
| 600 | 1 | 156 | 3.03 |
| | 4 | 180 | 3.36 |

What is claimed is:

1. A stainless steel surface having a passivation film on at least a portion thereof, said film having a thickness of more than 50 Å, said film containing mainly chrome oxide.

2. The stainless steel surface according to claim 1, wherein the stainless steel surface on which said passivation film is located has a flatness with the maximum height difference Cf the convex and the concave portions thereof being less than 1 μm within any circle 5 μm in radius.

* * * * *

UNITED STATES PATENT AND TRADEMARK OFFICE
CERTIFICATE OF CORRECTION

PATENT NO : 5,989,722
DATED : December 23, 1999
INVENTOR(S): Tadahiro Ohmi et, al.

It is certified that error appears in the above-identified patent and that said Letters Patent is hereby corrected as shown below:

Claim 2, Column 10, Line 45

"Cf" to --of--

Signed and Sealed this

Fourth Day of July, 2000

Attest:

Q. TODD DICKINSON

*Attesting Officer*         *Director of Patents and Trademarks*